(12) United States Patent
Nagai

(10) Patent No.: US 12,426,242 B2
(45) Date of Patent: Sep. 23, 2025

(54) SEMICONDUCTOR MEMORY DEVICE HAVING A BIT LINE CONTACT DISPOSED IN THE SUBSTRATE

(71) Applicant: Fujian Jinhua Integrated Circuit Co., Ltd., Quanzhou (CN)

(72) Inventor: Yukihiro Nagai, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 438 days.

(21) Appl. No.: 17/993,902

(22) Filed: Nov. 24, 2022

(65) Prior Publication Data

US 2024/0081043 A1    Mar. 7, 2024

(30) Foreign Application Priority Data

Sep. 1, 2022  (CN) .......................... 202211068099.X
Sep. 1, 2022  (CN) .......................... 202222323561.8

(51) Int. Cl.
  *H10B 12/00*   (2023.01)
  *H01L 23/528*  (2006.01)

(52) U.S. Cl.
  CPC ....... *H10B 12/312* (2023.02); *H01L 23/5283* (2013.01); *H10B 12/482* (2023.02); *H10B 12/485* (2023.02)

(58) Field of Classification Search
  CPC .... H10B 12/09; H10B 12/312; H10B 12/482; H10B 12/485; H10D 12/811; H10D 1/47
  USPC .......................................... 257/350, 906, 908
  See application file for complete search history.

(56) References Cited

U.S. PATENT DOCUMENTS

| | | | |
|---|---|---|---|
| 7,397,087 | B2 | 7/2008 | Chinthakindi et al. |
| 8,154,085 | B2* | 4/2012 | Ishibashi ................ H10B 41/40 |
| | | | 257/E27.035 |
| 8,927,385 | B2 | 1/2015 | Nandakumar et al. |
| 10,679,997 | B2 | 6/2020 | Jung et al. |
| 10,840,248 | B2 | 11/2020 | Nagai |
| 2007/0096183 | A1 | 5/2007 | Ogawa et al. |
| 2009/0286378 | A1 | 11/2009 | Hase |
| 2013/0241001 | A1 | 9/2013 | Chen et al. |
| 2014/0308785 | A1 | 10/2014 | Yeh et al. |

* cited by examiner

*Primary Examiner* — Hoai V Pham
(74) *Attorney, Agent, or Firm* — Winston Hsu

(57) ABSTRACT

The present disclosure provides a semiconductor device and a method of fabricating the same, which includes a substrate, a resistor structure, a bit line structure, and a bit line contact. The substrate has an active area and a plurality of isolating regions. The resistor structure is disposed on the isolating regions, and includes a first semiconductor layer, a first capping layer, a first spacer. The bit line structure is disposed on the substrate to intersect the active area and the isolating regions, and includes a second semiconductor layer, a first conductive layer, a second capping layer, and a second spacer. The bit line contact is disposed in the substrate to partially extend into the second semiconductor layer, wherein the bit line contact and the first semiconductor layer include a same semiconductor material.

12 Claims, 18 Drawing Sheets

SEMICONDUCTOR MEMORY DEVICE HAVING A BIT LINE CONTACT DISPOSED IN THE SUBSTRATE

BACKGROUND OF THE INVENTION

1. Field of the Invention

The present disclosure relates generally to a semiconductor device and a method of fabricating the same, and more particularly to a semiconductor memory device and a method of fabricating the same.

2. Description of the Prior Art

According to the current semiconductor technology, it is able to integrate control circuits, memories, low-voltage operating circuits, and high-voltage operating circuits and components on a single chip together, thereby reducing costs and improving operating efficiency. In addition, as the size of semiconductor components becomes smaller and smaller, there are many improvements in the process steps of forming transistors, memories, and resistors to fabricate various semiconductor components with small volume and high quality. However, as the size of devices continues to decrease, it becomes more difficult to dispose more than one semiconductor component within the same device, and the fabricating process thereof also faces many limitations and challenges. Thus, the currently semiconductor technology still requires further improvements to meet the industrial requirements to promote the fabricating efficiency, as well as the functions and reliability of the device.

SUMMARY OF THE INVENTION

An object of the present disclosure is to provide a semiconductor memory device and a fabricating method thereof, where a memory and a resistor are simultaneously formed in the same device. In this way, the resistor formed thereby is allowable to obtain better structural reliability and stable surface resistance, under a simplified process flow.

To achieve the aforementioned objects, the present disclosure provides a semiconductor memory device including a substrate, a resistor structure, a bit line structure, and a bit line contact. The substrate has an active area and a plurality of isolating regions. The resistor structure is disposed on the isolating regions, and includes a first semiconductor layer, a first capping layer disposed on the first semiconductor, and a first spacer disposed on sidewalls of the first semiconductor layer and the first capping layer. The bit line structure is disposed on the substrate to intersect the active area and the isolating regions, and includes a second semiconductor layer, a first conductive layer disposed on the second semiconductor layer, a second capping layer disposed on the first conductive layer, and a second spacer physically contacting the second semiconductor layer, the first conductive layer, and the second capping layer. The bit line contact is disposed in the substrate to partially extend into the second semiconductor layer, wherein the bit line contact and the first semiconductor layer include a same semiconductor material.

To achieve the aforementioned objects, the present disclosure provides a method of fabricating a semiconductor memory device including the following steps. Firstly, a substrate is provided, and the substrate has an active area and a plurality of isolating regions. A resistor structure is formed on the isolating regions, and the resistor structure includes a first semiconductor layer, a first capping layer disposed on the first semiconductor, and a first spacer disposed on sidewalls of the first semiconductor layer and the first capping layer. A bit line structure is formed on the substrate to intersect the active area and the isolating regions, and includes a second semiconductor layer, a first conductive layer disposed on the second semiconductor layer, a second capping layer disposed on the first conductive layer, and a second spacer physically contacting the second semiconductor layer, the first conductive layer, and the second capping layer. The bit line contact is disposed in the substrate to partially extend into the second semiconductor layer, wherein the bit line contact and the first semiconductor layer include a same semiconductor material.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are directed to provide a better understanding of the embodiments and are included as parts of the specification of the present disclosure. These drawings and descriptions are used to illustrate the principles of the embodiments. It should be noted that all drawings are schematic, and the relative dimensions and scales have been adjusted for the convenience of drawing. Identical or similar features in different embodiments are marked with identical symbols.

FIG. 1 to FIG. 10 illustrate schematic diagrams of a method of fabricating a semiconductor memory device according to a first embodiment of the present disclosure, wherein:

FIG. 1 is a schematic cross-sectional view of a semiconductor memory device after forming a contact opening;

FIG. 2 is a schematic cross-sectional view of a semiconductor memory device after performing a patterning process;

FIG. 3 is a schematic cross-sectional view of a semiconductor memory device after forming a conductive material layer;

FIG. 4 is a schematic cross-sectional view of a semiconductor memory device after forming a first mask layer;

FIG. 5 is a schematic cross-sectional view of a semiconductor memory device after forming a bit line contact;

FIG. 6 is a schematic cross-sectional view of a semiconductor memory device after forming a capping material layer;

FIG. 7 is a schematic cross-sectional view of a semiconductor memory device after forming a second mask layer;

FIG. 8 is a schematic cross-sectional view of a semiconductor memory device after a bit line structure;

FIG. 9 is a schematic cross-sectional view of a semiconductor memory device after forming a spacer; and FIG. 10 is a schematic cross-sectional view of a semiconductor memory device after forming a plug.

FIG. 12 to FIG. 16 illustrate schematic diagrams of a method of fabricating a semiconductor memory device according to a second embodiment of the present disclosure, wherein:

FIG. 12 is a schematic cross-sectional view of a semiconductor memory device after forming a contact opening;

FIG. 13 is a schematic cross-sectional view of a semiconductor memory device after forming a bit line contact;

FIG. 14 is a schematic cross-sectional view of a semiconductor memory device after forming a first mask layer;

FIG. 15 is a schematic cross-sectional view of a semiconductor memory device after forming a plug; and FIG. 16 illustrates a schematic diagram of a semiconductor memory device according to another embodiment of the present disclosure.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
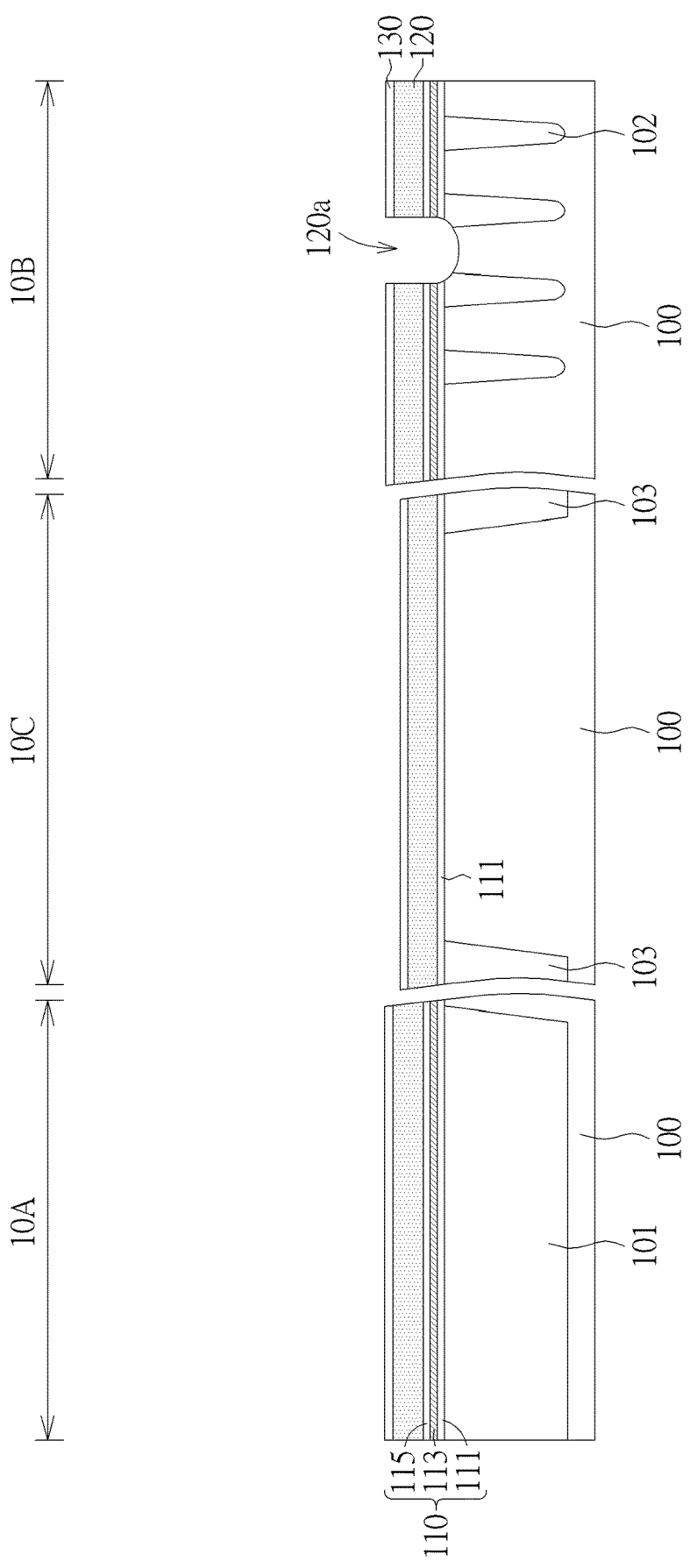

Please refer to FIG. 1 to FIG. 10, which illustrating schematic diagrams of a method of fabricating a semiconductor memory device 10 according to the first embodiment of the present disclosure. Firstly, as shown in FIG. 1, a substrate 100 is provided, for example including a silicon substrate, an epitaxial silicon substrate, or a silicon on insulation (SOI) substrate, and a plurality of isolating regions 101, 102, 103 such as being shallow trench isolations (STIs) is formed in the substrate 100, so as to define a plurality of active areas (not shown in the drawings) within the substrate 100. The substrate 100 for example includes at least three regions, a first region 10A, a second region 10B, and a third region 10C for disposing different semiconductor components, and each of the isolating regions 101, 102, 103 is respectively disposed within the first region 10A, the second region 10B, and the third region 10C. In the preset embodiment, the first region 10A for example includes a resistor region for disposing a resistor structure, the second region 10B for example includes a memory region for disposing a memory structure, and the third region 10C for example includes a transistor region for disposing a transistor structure, but is not limited thereto. To people well-skilled in the arts, the first region 10A, the second region 10B, and the third region 10C may be disposed directly adjacent to each other, or, another region may be further disposed therebetween. For example, a periphery region (not shown in the drawings) may be additionally disposed between the second region 10B and the third region 10C, but not limited thereto.

Next, plural deposition processes are sequentially performed on the substrate 100, to form a dielectric layer 110, a semiconductor material layer 120, and a covering material layer 130 stacked from bottom to top on the substrate 100, with the dielectric layer 110 preferably including a composite structure. For example, the dielectric layer 110 includes a first silicon oxide layer 111-a silicon nitride layer 113-a second silicon oxide layer 115 (oxide-nitride-oxide, ONO) structure stacked from bottom to top, the semiconductor material layer 120 may include a semiconductor material with dopants such as being polysilicon, and the covering material layer 130 may include an insulating material like silicon oxide or silicon oxynitride, but not limited thereto.

It is noted that, the dielectric layer 110 entirely covers the active areas and the isolating regions 101, 102, 103 within the first region 10A, the second region 10B, and the third region 10C at the beginning, and the second silicon oxide layer 115 and the silicon nitride layer 113 disposed within the third region 10C are removed before performing the deposition process of the semiconductor material layer 120, with the active areas and the isolating regions 103 within the third region 10C being covered only by the first silicon oxide layer 111, as shown in FIG. 1. Accordingly, the semiconductor material layer 120 and the covering material layer 130 formed within the third region 10C may therefore obtain relative lower disposing positions in comparison with that of the semiconductor material layer 120 and the covering material layer 130 formed within other regions. Otherwise, in another embodiment, the dielectric layer 110 within the third region 10C may be completely removed, to exposed the surface of the substrate 110, and a thermal oxidation process is performed to additionally form a silicon oxide layer (not shown in the drawings) of the exposed surface of the substrate 110.

Furthermore, as shown in FIG. 1, an etching process is performed through a mask layer (not shown in the drawings), after forming the covering material layer 130, to define a contact opening 120a in the second region 10B. precisely speaking, the contact opening 120a penetrates the covering material layer 130, the semiconductor material layer 120, and the dielectric layer 110, to exposed a portion of the substrate 100 for forming a bit line contact in the subsequent process. Then, the mask layer is completely removed.

Figure 2:
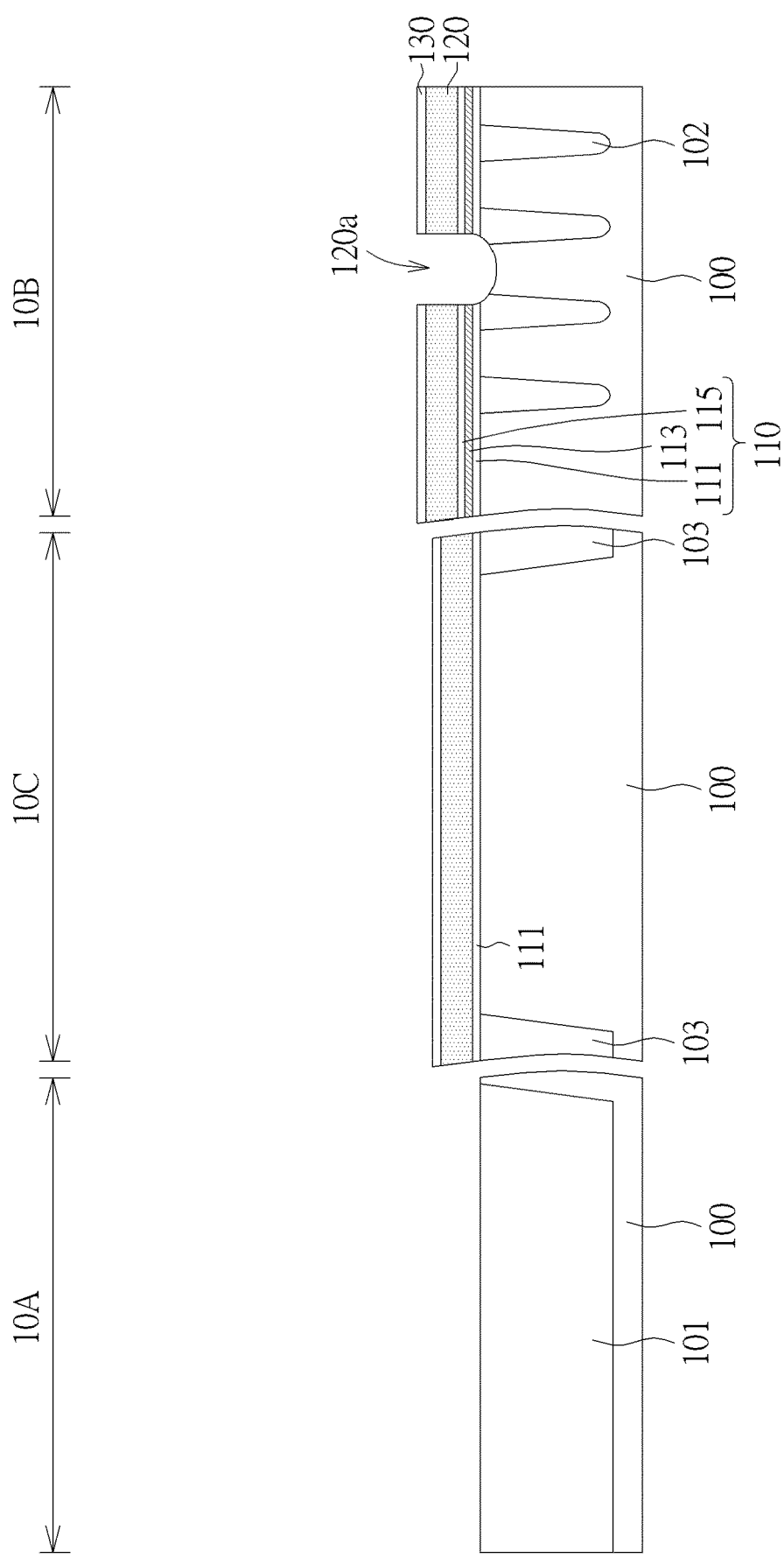

As shown in FIG. 2, another etching process is performed through another mask layer (not shown in the drawings), to completely remove the covering material layer 130, the semiconductor material layer 120, and the dielectric layer 110 within the first region 10A, to exposed the top surface of the isolating region 101 and the substrate 110. Then, the another mask layer is completely removed.

Figure 3:
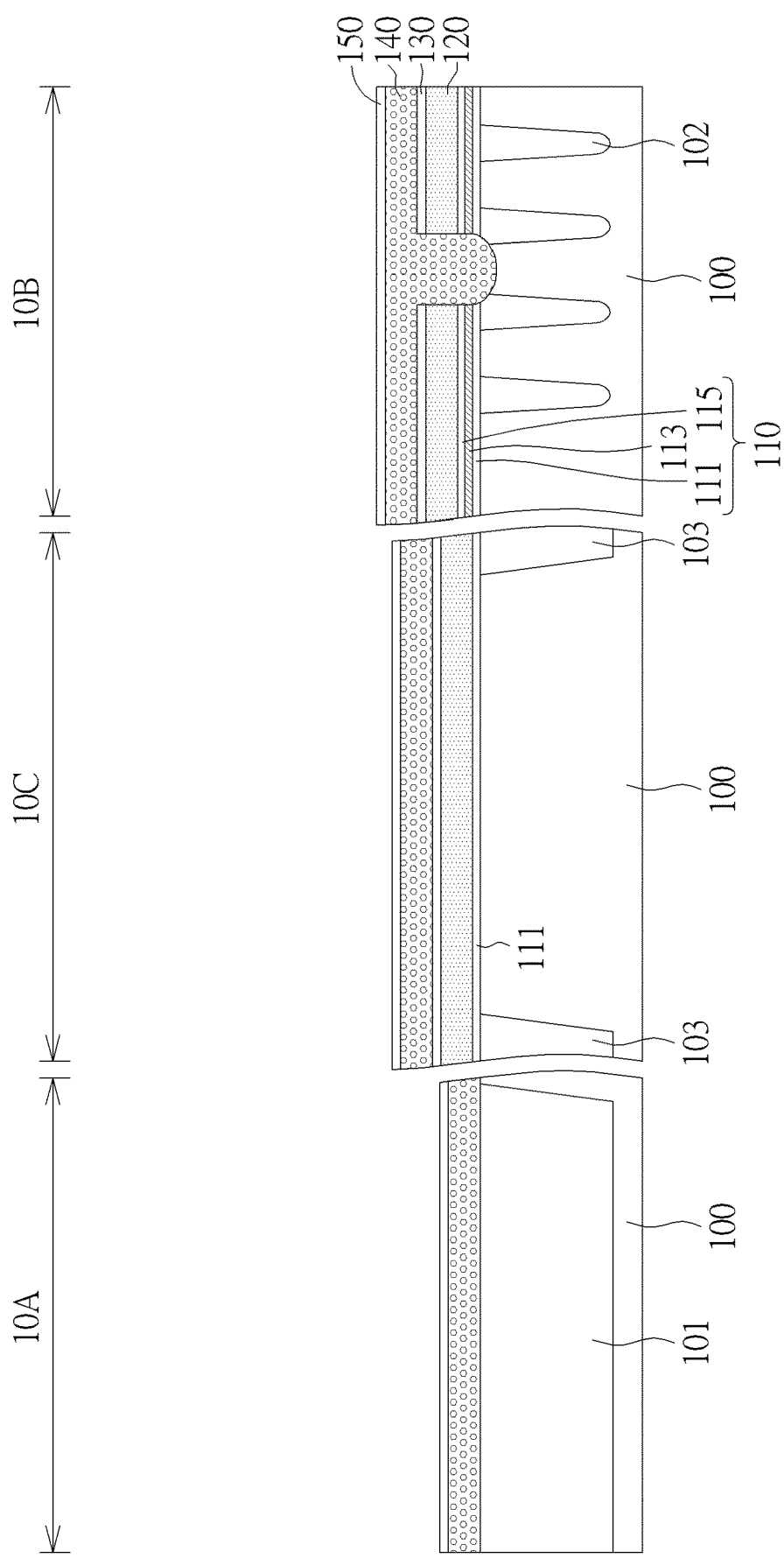

Next, as shown in FIG. 3, two deposition processes are performed, to sequentially form a conductor material layer 140 and a first capping material layer 150. Precisely speaking, the conductor material layer 140 and the first capping layer 150 both entirely covers the first region 10A, the second region 10B, and the third region 10C, wherein the conductor material layer 140 is further filled in the contact opening 120a within the second region 10B. In one embodiment, the conductor material layer 140 for example includes a semiconductor material with dopants, such as being polysilicon, silicon phosphide (SiP), and preferably includes SiP, and the first capping material layer 150 for example includes an insulating material like silicon nitride (SiN), silicon carbonitride (SiCN), but is not limited thereto. It is noted that, since the conductor material layer 140 and the first capping material layer 150 formed within the first region 10A directly covers the top surfaces of the substrate 100 and the isolating region 101, which may therefore be disposed at a relative lower disposing positions, so as to obtain a relative lower top surface in comparison with that of the conductor material layer 140 and the first capping material layer 150 formed within other regions.

Figure 4:
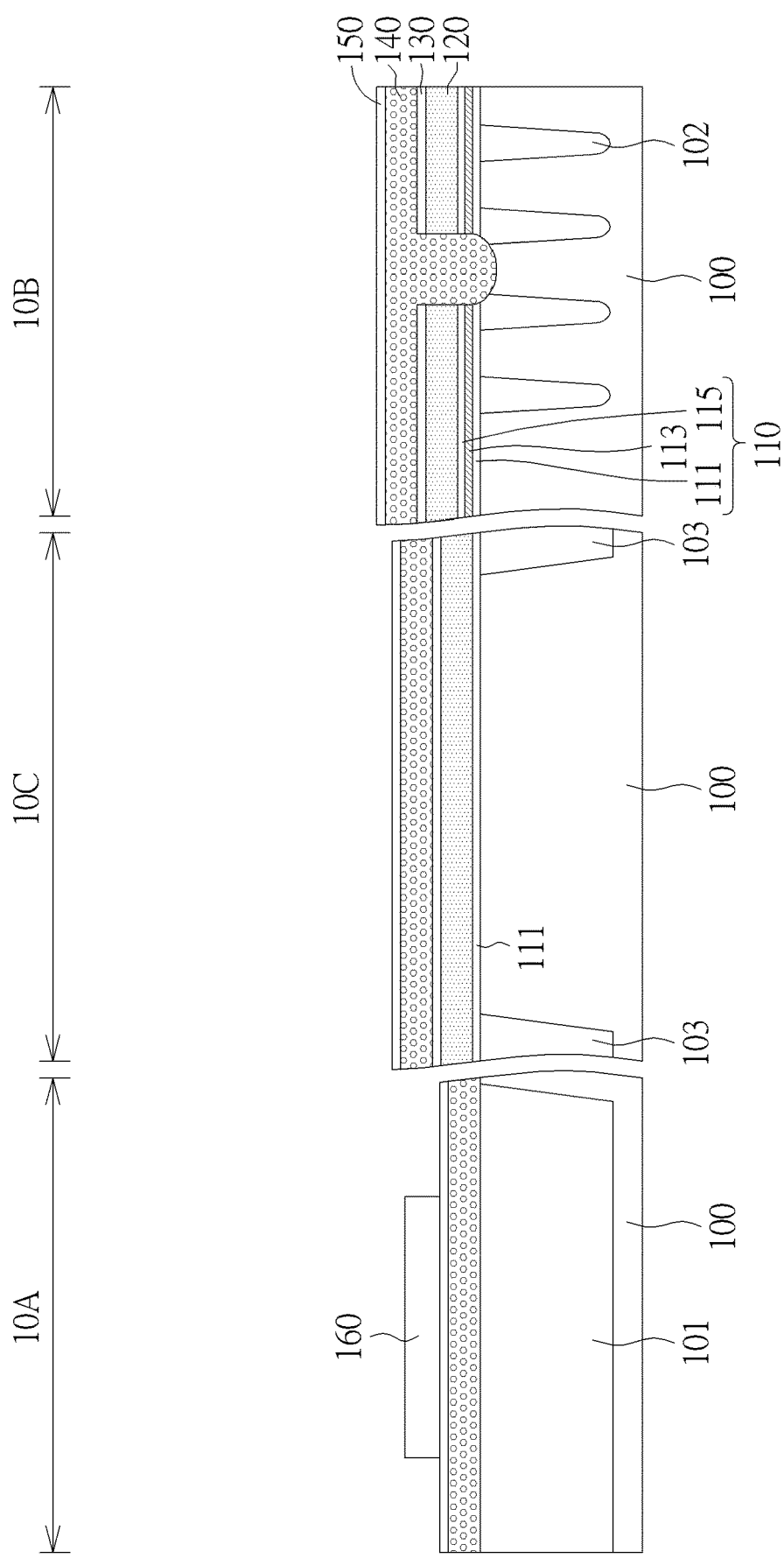
Figure 5:
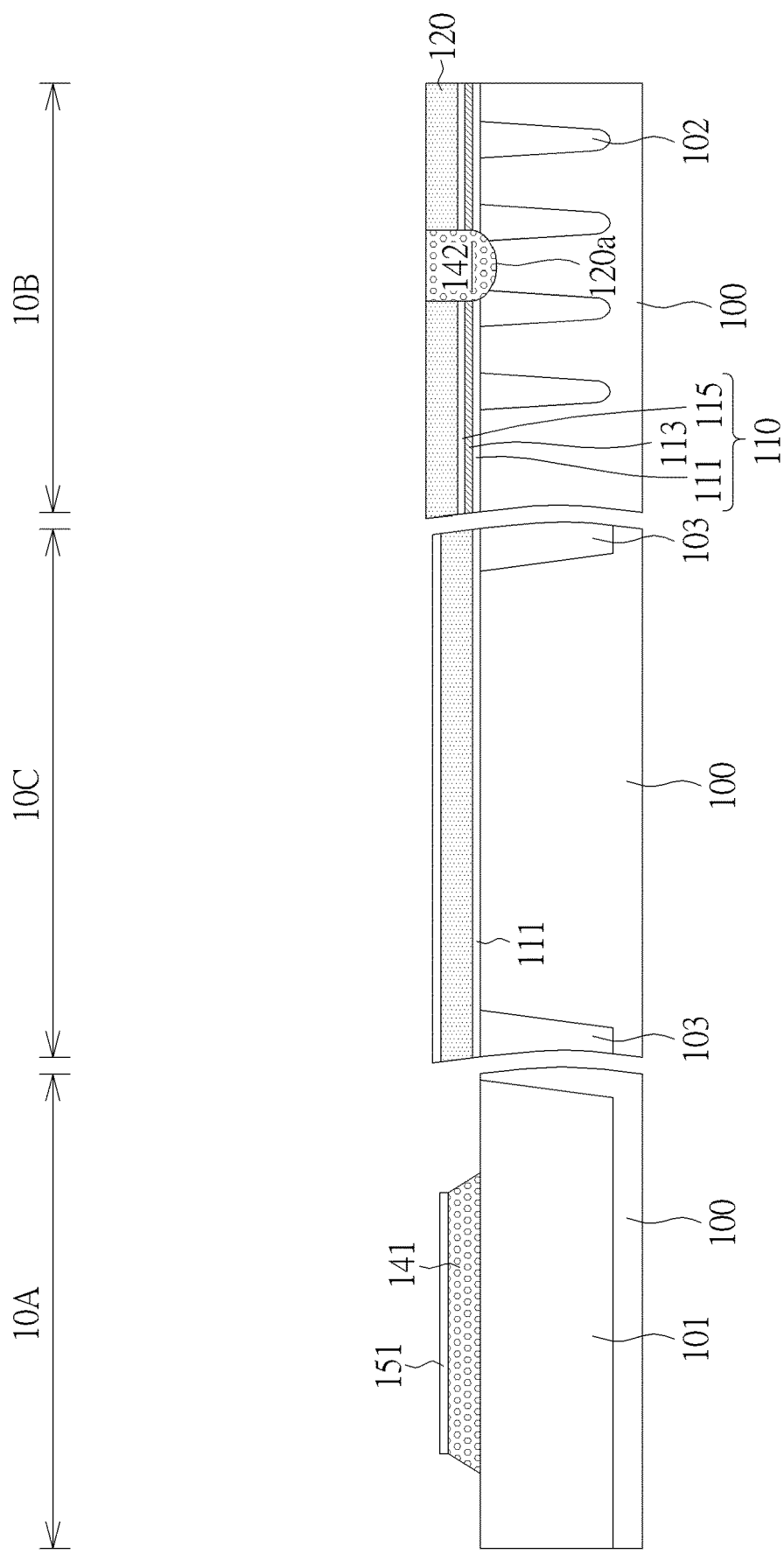

As shown in FIG. 4, a first masking layer 160 is formed in the first region 10A to cover the first capping material layer 150, and a patterning process is performed through the first mask layer 160, to transfer the pattern of the first mask layer 160 into the first capping material layer 150 and the conductor material layer 140 underneath, thereby forming a first capping layer 151 and a first semiconductor layer 141 within the first region 10A, as shown in FIG. 5. Meanwhile, the first capping material layer 150, the conductor material layer 140, and the covering material layer 130 within the second region 10B and the third region 10C are removed, to only remain the conductor material layer 140 filled in the contact opening 120a, to configure as a bit line contact 142. Then, the first mask layer 160 is completely removed.

Figure 6:
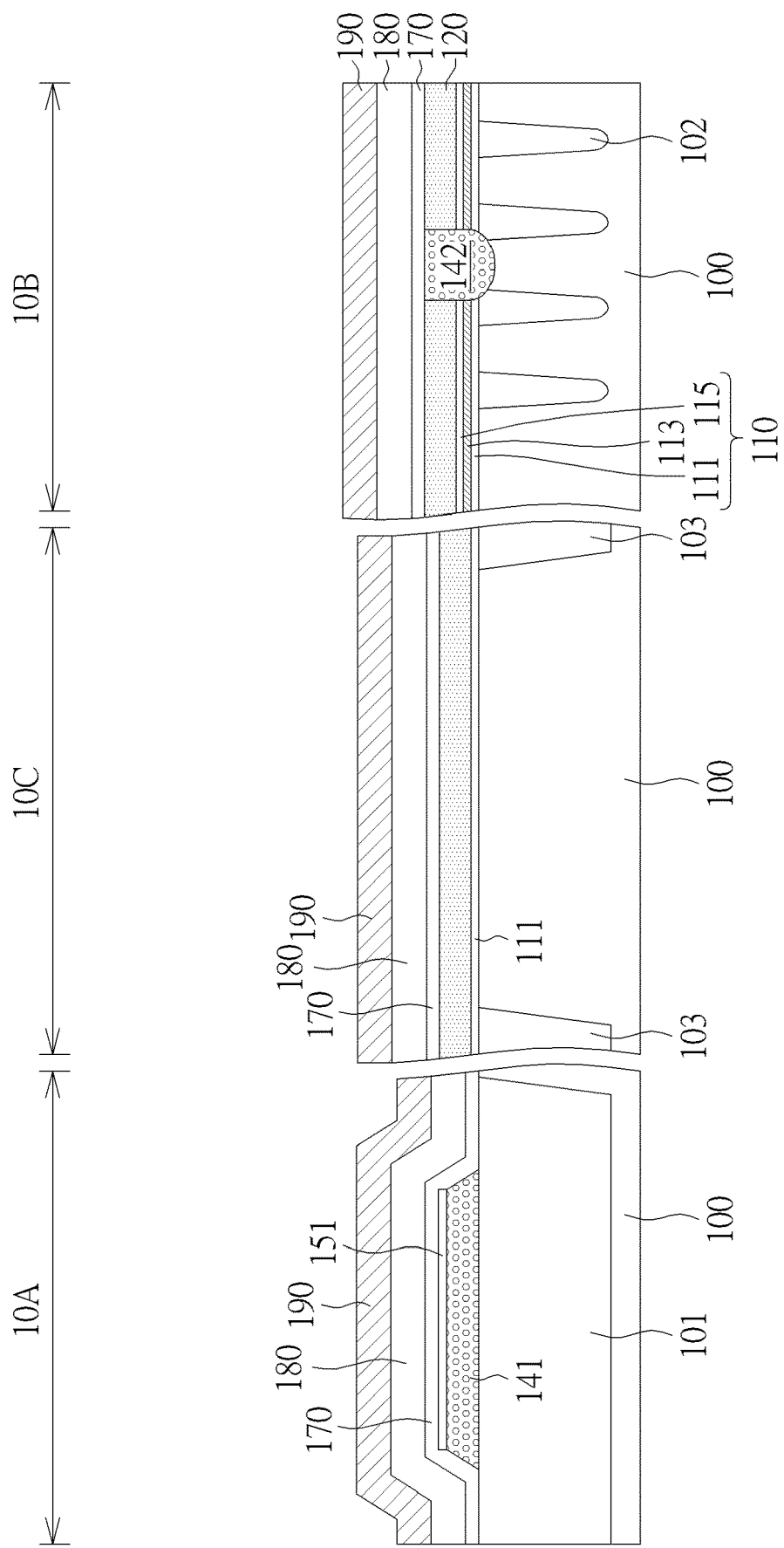

As shown in FIG. 6, plural of deposition processes are sequentially performed on the substrate 100 to form a barrier material layer 170, a conductive material layer 180, and a second capping material layer 190 stacked from bottom to top, with the barrier material layer 170, the conductive material layer 180, and the second capping material layer 190 being conformally covered on the first region 10A, the second region 10B, and the third region 10C. The barrier material layer 170 for example includes a material like titanium (Ti) and/or titanium nitride (TiN), tantalum (Ta) and/or tantalum nitride (TaN), the conductive material layer 180 for example includes a low-resistant metal like aluminum (Al), Ti, copper (Cu) or tungsten (W), and the second capping material layer 190 for example includes a material like silicon nitride or silicon carbonitride, but not limited thereto.

Figure 7:
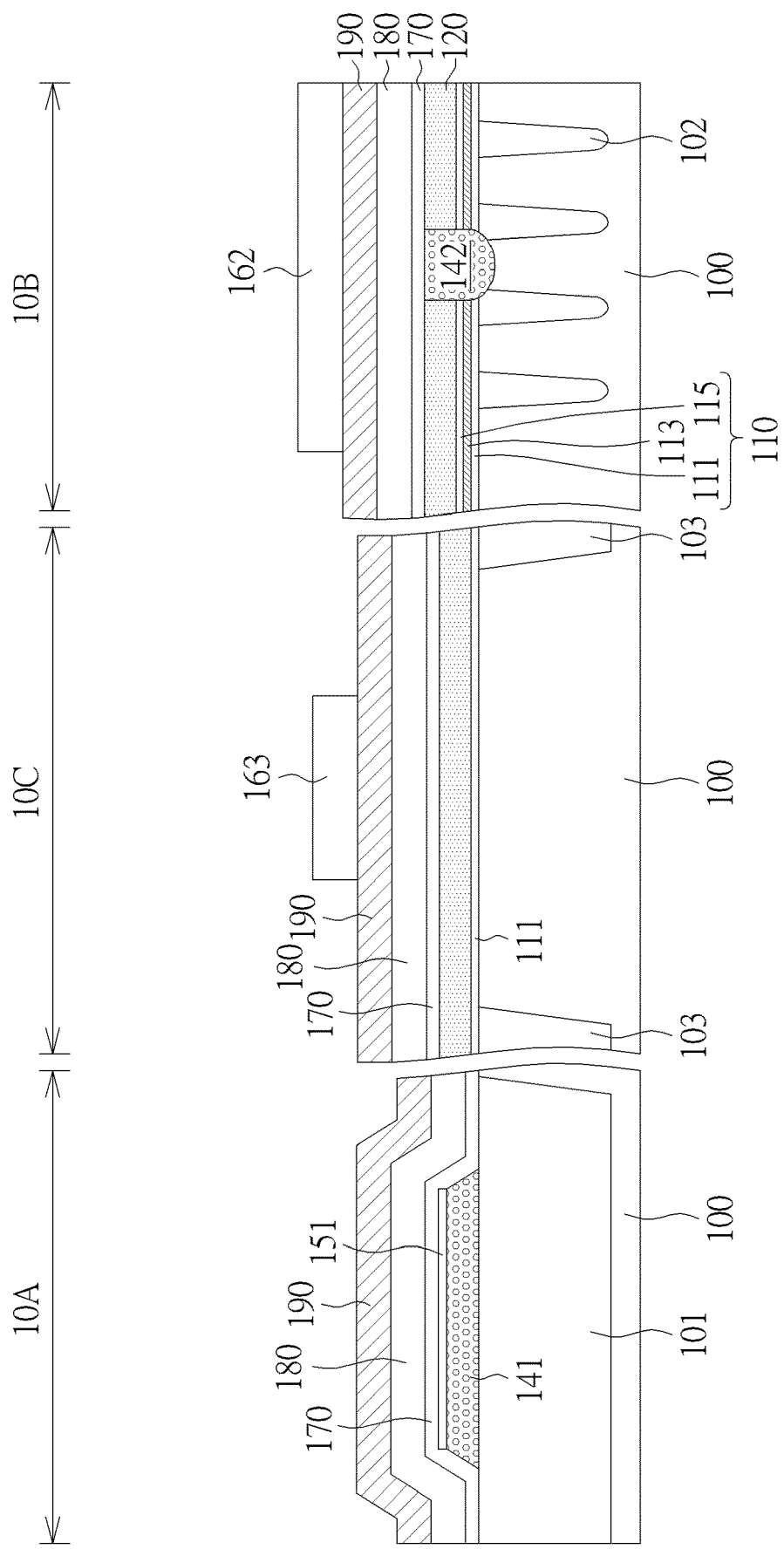
Figure 8:
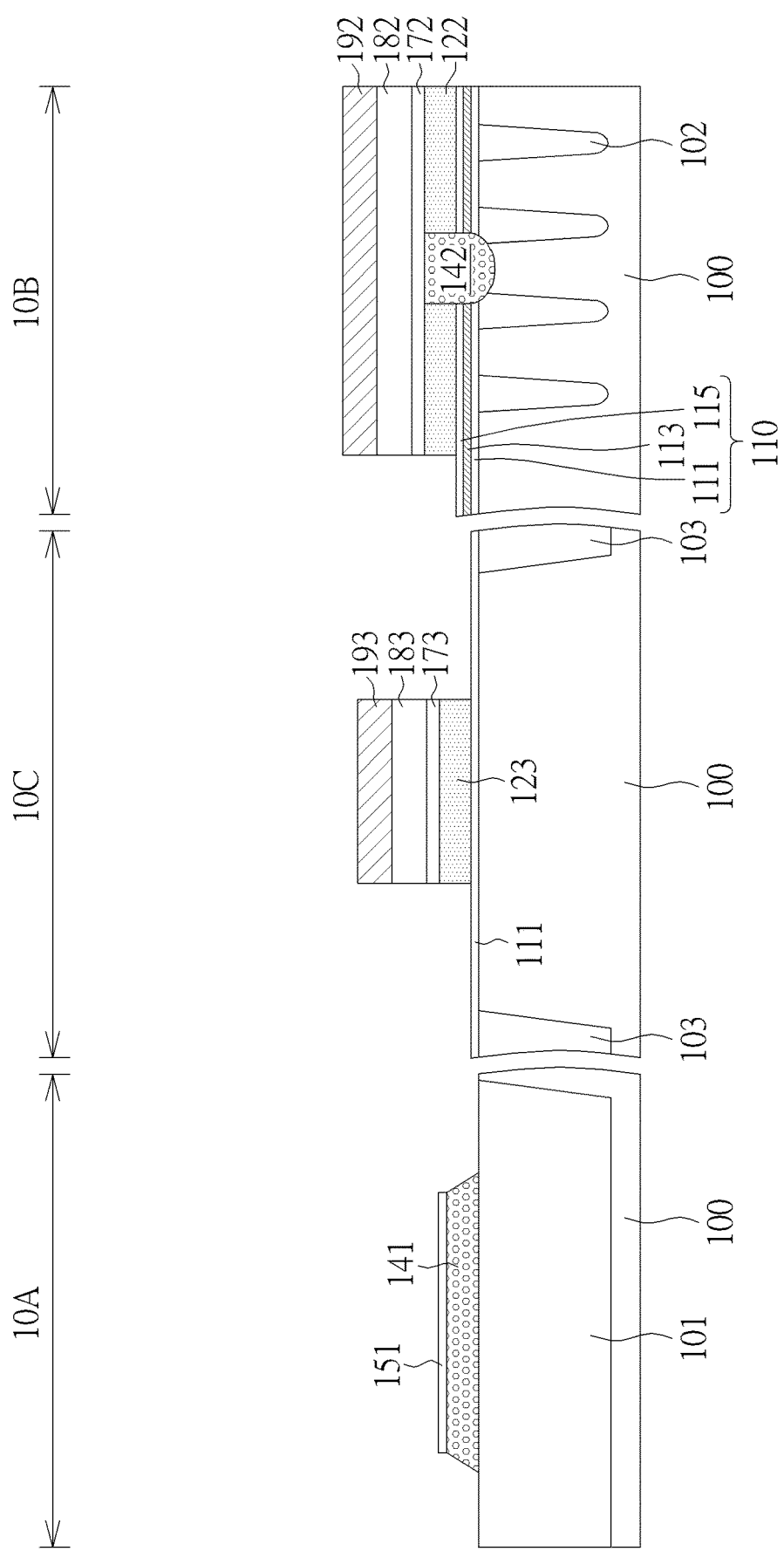

As shown in FIG. 7, second mask layers 162, 163 are respectively formed within the second region 10B and the third region 10C, covering on the second capping material layer 190, and another patterning process is performed through the second mask layers 162, 163, to transfer the patterns of the second mask layers 162, 163 into the stacked layers (including the second capping material layer 190, the conductive material layer 180, the barrier material layer 170, and the semiconductor material layer 120) underneath, to form stacked structures as shown in FIG. 8 in the second region 10B and the third region 10C.

It is noted that, the second mask layers 162, 162 are only formed within the second region 10B and the third region 10C, so that, the second capping material layer 190, the conductive material layer 180, and the barrier material layer 170 covered on the first region 10A may be completely removed, to expose the first capping layer 151 and the first semiconductor layer 141. On the other hand, the stacked structure formed within the second region 10B includes the second semiconductor layer 122, the first barrier layer 172, the first conductive layer 182, and the second capping layer 192 stacked from bottom to top, with the bit line contact 142 being partially disposed within the second semiconductor layer 122, and the stacked structure formed within the third region 10C includes a semiconductor layer 123, a barrier layer 173, a conductive layer 183, and a capping layer 193 stacked from bottom to top, as shown in FIG. 8. After that, the second mask layers 162, 163 are removed.

Figure 9:
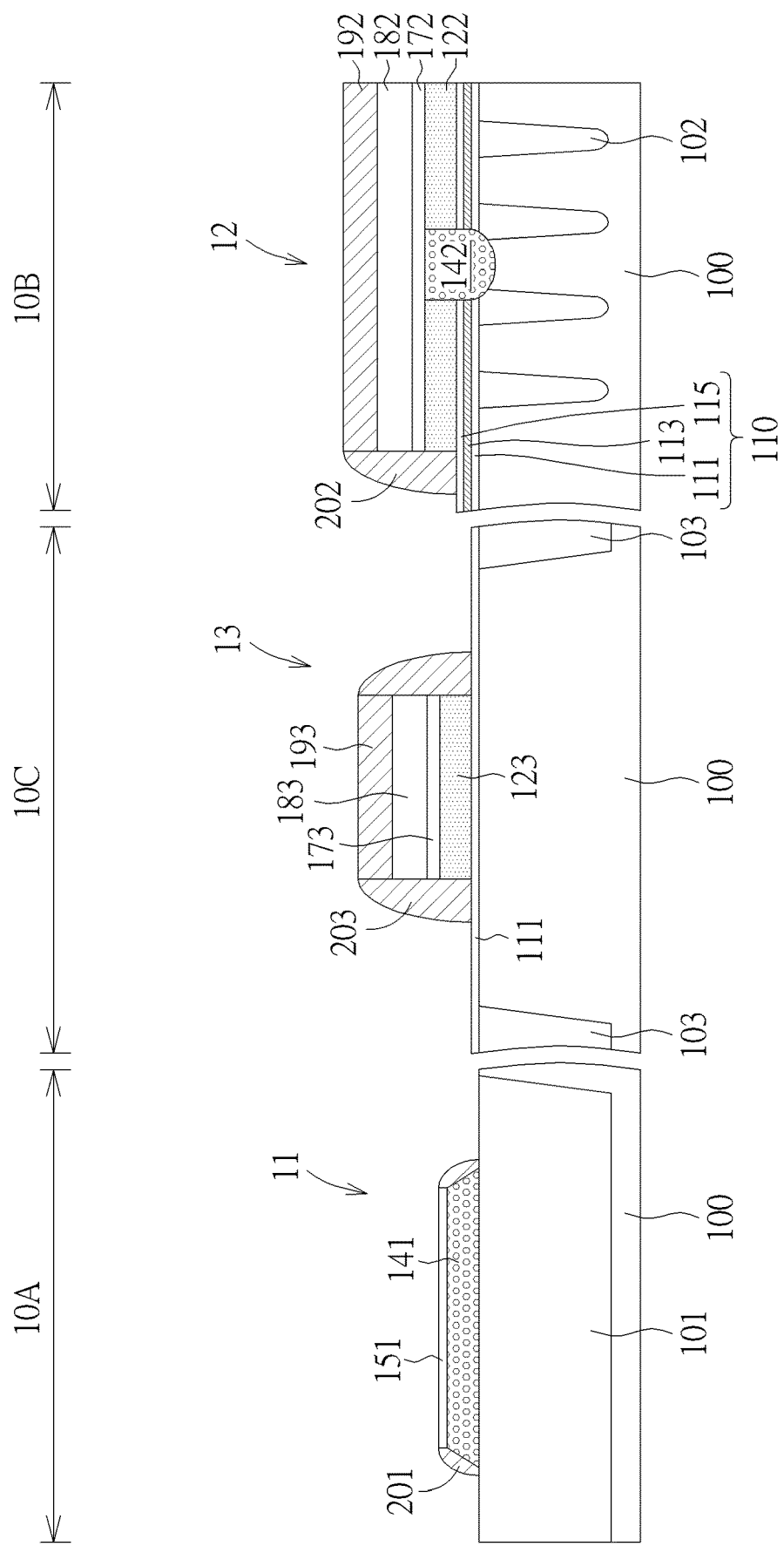

As shown in FIG. 9, a deposition process and an etching back process are sequentially performed to form a first spacer 201 on sidewalls of the first semiconductor layer 141 and the first capping layer 151 stacked sequentially in the first region 10A, to form a second spacer 202 on sidewalls of the second semiconductor layer 122, the first barrier layer 172, the first conductive layer 182, and the second capping layer 192 stacked sequentially in the second region 10B, and to form a spacer 203 on sidewalls of the semiconductor layer 123, the barrier layer 173, the conductive layer 183, and the capping layer 193 stacked sequentially in the third region 10C. Accordingly, the first spacer 201, the second spacer 202, and the spacer 203 may all include the same material like silicon nitride or silicon carbonitride, and preferably includes a material which is the same as that of the first capping layer 192 and the capping layer 193, such as being silicon nitride, but not limited thereto.

With these arrangements, a resistor structure 11 is formed within the first region 10A, a bit line structure 12 is formed within the second region 10B, and a gate line structure 13 is formed within the third region 10C at the same time, but not limited thereto. As shown in FIG. 9, the resistor structure 11 is disposed directly on the isolating region 101, to obtain a relative lower bottom surface, and the resistor structure 11 includes the first semiconductor layer 141, the first capping layer 151, and the first spacer 201 physically contacting the sidewalls of the first semiconductor layer 141 and the first capping layer 151.

The bit line structure 12 is directly disposed on the dielectric layer 110, to extend along a direction (not shown in the drawings) to intersect with the active areas and the isolating regions 102. As shown in FIG. 9, the bit line structure 12 includes the second semiconductor layer 122, the first barrier layer 172, the first conductive layer 182, and the second capping layer 192 stacked from bottom to top, and further includes the second spacer 202 physically contacting the sidewalls of the second semiconductor layer 122, the first barrier layer 172, the first conductive layer 182, and the second capping layer 192, so that, the top surface of the bit line structure 12 may be obviously higher than the top surface of the resistor structure 11 or the gate line structure 13. It is noted that, the bit line contact 142 is further disposed under the bit line structure 12, with the bit line contact 142 being disposed in the active areas of the substrate 100 to further extend into the second semiconductor layer 122. In the present embodiment, the bit line contact 142 and second semiconductor layer 122 of the bit line structure 12 are individually fabricated through different processes, so as to include different semiconductor materials. For example, the bit line contact 142 for example include doped silicon phosphide, and the second semiconductor layer 122 for example include doped polysilicon, but is not limited thereto. Also, the bit line contact 142 and the first semiconductor layer 141 of the resistor structure 11 are fabricated through the same process, so as to include the same semiconductor material (such as silicon phosphide). It is noteworthy that, in addition to the bit line structure 12, a plurality of gates (not shown in the drawings), at least one transistor (not shown in the drawings), and at least one capacitor (not shown in the drawings) may be further formed within the second region 10B, to together form a dynamic random access memory (DRAM, not shown in the drawings) with a buried gate, but is not limited thereto.

On the other hands, the gate line structure 13 is directly disposed on the first oxide layer 111 to precisely include the semiconductor layer 123, the barrier layer 173, the conductive layer 183, and the capping layer 193, and further includes the spacer 203 physically contacting the sidewalls of the semiconductor layer 123, the barrier layer 173, the conductive layer 183 and the capping layer 193. Accordingly, the spacer 203 of the gate line structure 13 may obtain the top surface which is slightly lower than that of the second spacer 202, as shown in FIG. 9. In the present embodiment, the gate line structure 13 and the bit line structure 12 may be fabricated through the same process, so that, the semiconductor layer 123, the barrier layer 173, the conductive layer 183, the capping layer 193, and the spacer 203 of the gate line structure 13 may respectively include the same material and the same thickness as those of the second semiconductor layer 122, the first barrier layer 172, the first conductive layer 182, the second capping layer 192, and the second spacer 202 of the bit line structure 12, but not limited thereto. However, the first semiconductor layer 141 and the first capping layer 151 of the resistor structure 11 may include different materials and different thicknesses from those of the second semiconductor layer 122 and the second capping layer 192 of the bit line structure 12, or the semiconductor layer 123 and the capping layer 193 of the gate line structure 13.

Figure 10:
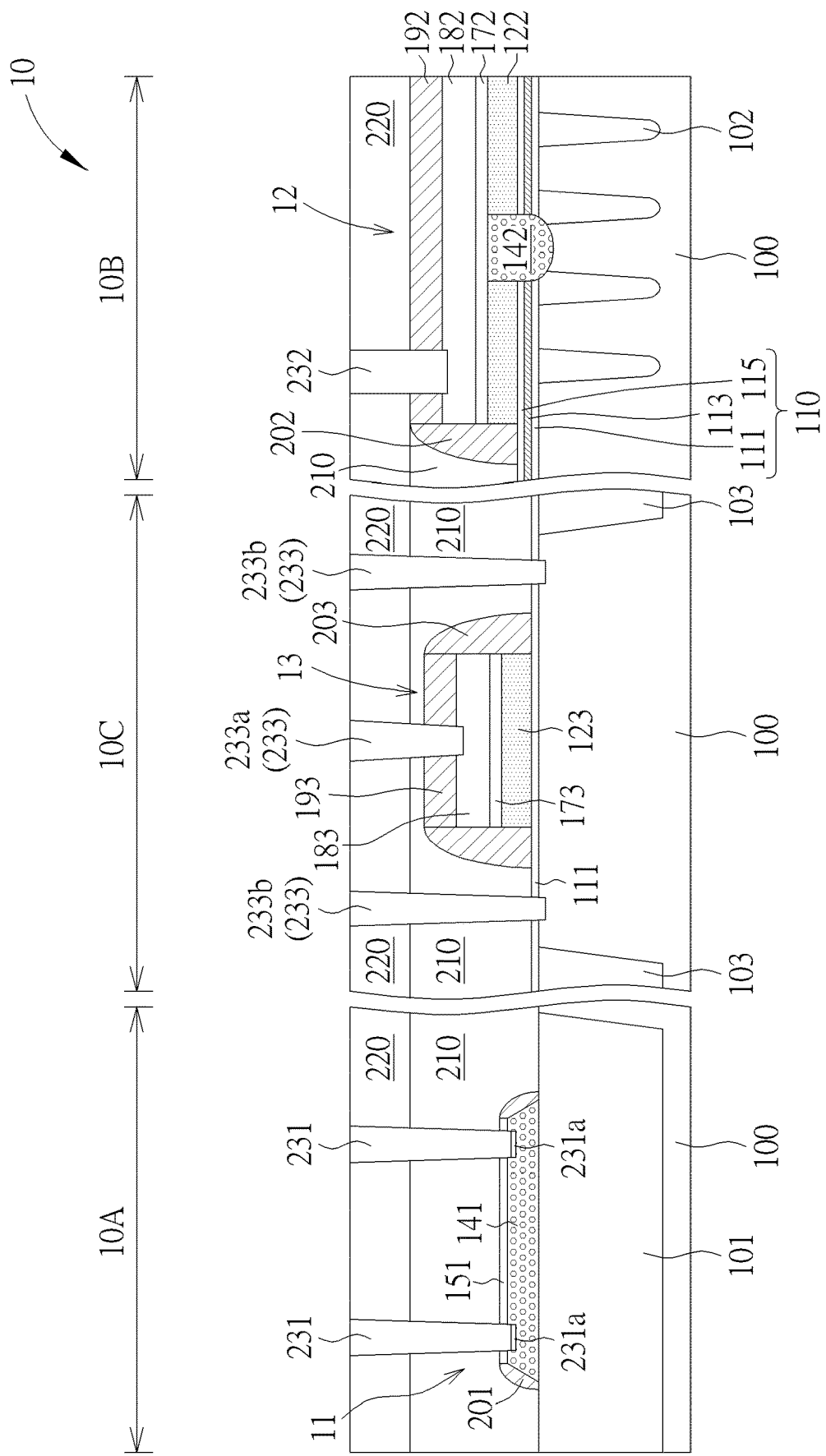

Following these, as shown in FIG. 10, an interlayer dielectric layer 210, an intermetal dielectric layer 220, and a plurality of plugs 231, 232, 233 are sequentially formed on the substrate 100, wherein the interlayer dielectric layer 210 completely covers the resistor structure 11 within the first region 10A and the gate line structure 13 within the third region 10C, with the top surface of the interlayer dielectric layer 210 being coplanar with the top surface of the second capping layer 192 of the bit line structure 12. Precisely speaking, each of the plugs 231 which is electrically connected to the resistor structure 11 penetrates through the first capping layer 151 to physically contact the first semiconductor layer 141 of the resistor structure 11. Also, since the first semiconductor layer 141 includes the semiconductor material like polysilicon, a silicide layer 231a may be further formed between each of the plugs 231 and the first semiconductor layer 141, to enhance the electrically connection between the plugs 231 and the first semiconductor layer 141. The plugs 232 which are electrically connected to the second region 10B penetrate through the second capping layer 192 to physically contact the first conductive layer 182, and the plugs 233 which are electrically connected to the third region 10C further include a plug 233a penetrating through the capping layer 193 to physically contact the conductive layer 183 of the gate line structure 13, and plugs 233b penetrating through the first oxide layer 111 to physically contact the two doped regions (not shown in the drawings) at two sides of the gate line structure 13, in the substrate 100.

Through these performances, the fabrication of the semiconductor memory device 10 according to the first embodiment of the present disclosure is accomplished. According to the aforementioned processes, the formation of the resistor structure 11 is allowable to be integrated in to a general fabricating process of the bit line structure 12, simultaneously forming the bit line contact 142 of the bit line structure 12 and the first semiconductor layer 141 of the resistor structure 11 through the fabricating processes the bit line contact 142. Then, the resistor structure 11 may includes the first semiconductor layer 141 having silicon phosphide, the first capping layer 151 having an insulating material, and the first spacer 201, with each plug 231 which is electrically connected to the resistor structure 11 being directly contacting the first semiconductor layer 141, to providing a relative higher resistance thereby. In this way, a resistor may be successfully formed within a region (namely, the first region 10A) while forming a memory in another region (namely, the second region 10B) of the semiconductor memory device 10, so as to promote the fabricating efficiency of the resistor structure 11. Moreover, the fabricating method of the present embodiment also enables to from the gate line structure 13 in the third region 10C simultaneously, so that, the formation of the gate line structure 13 may also be integrated into the general fabricating process of the bit line structure 12, so as to significantly improve the fabrication efficiency of the semiconductor memory device 10. Also, the semiconductor memory device 10 obtained thereby may therefore gain better performances and structural reliability.

However, people well known in the arts should easily realize the semiconductor memory device 10 and the fabricating method thereof in the present disclosure is not limited to the aforementioned embodiment, and may further include other examples or variety. For example, in another embodiment, the fabrication of the gate line structure 13 may not be integrated into the general fabrication of the bit line structure 12, with the gate line structure 13 being fabricated individually within the third region 10C, after forming the bit line structure 12, but is not limited thereto. The following description will detail the different embodiments of the semiconductor memory device and fabricating method thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 11:
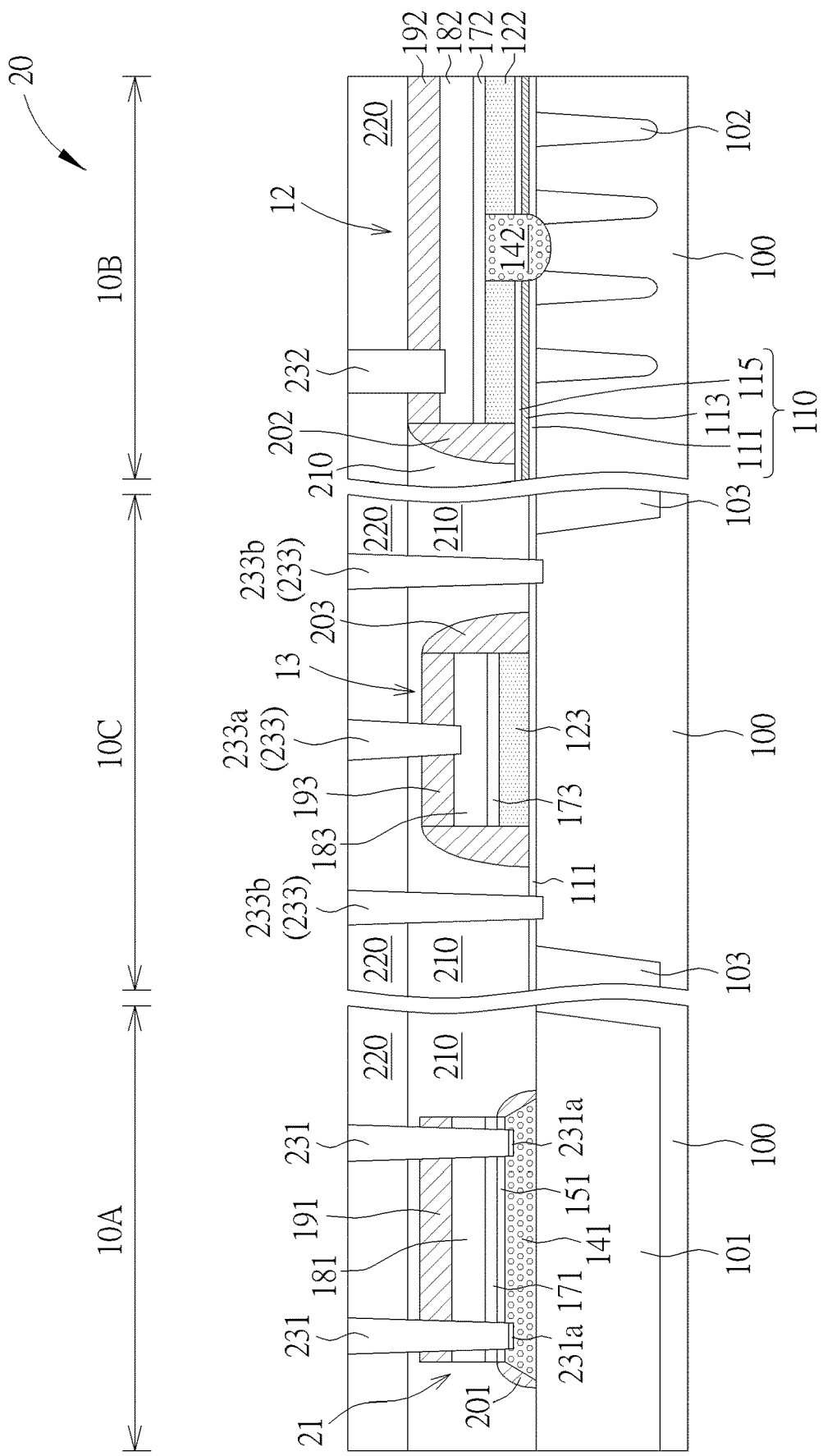
FIG. 11 illustrates a schematic diagram of a semiconductor memory device according to another embodiment of the present disclosure.

Please refer to FIG. 11, which is a schematic diagram illustrating a fabricating method of a semiconductor memory device 20 according to another embodiment of the present disclosure. The fabricating method of the semiconductor memory device 20 in the front end of the present embodiment are substantially the same as those in the aforementioned first embodiment, as shown in FIG. 1 to FIG. 6, and all the similarities will not be redundantly described hereinafter. The difference between the present embodiment and the aforementioned first embodiment is in that a mask layer (not shown in the drawings) is formed within the first region 10A while forming the second mask layers 162, 163 within the second region 10B and the third region 10C. Then, a patterning process is performed through the second mask layers 162, 163 and the mask layer at the same time, to transfer the patterns of the second mask layers 162, 163 and the mask layer into the stacked layers (including the second capping material layer 190, the conductive material layer 180, the barrier material layer 170, and the semiconductor material layer 120 stacked sequentially) underneath, to form stacked structures as shown in FIG. 11 within each region (including the first region 10A, the second region 10B, and the third region 10C).

Precisely speaking, the stacked structures formed within the second region 10B and the third region 10C are substantially the same as those formed in the aforementioned embodiment, and the stacked structure formed within the first region 10A includes the first semiconductor layer 141, the first capping layer 151, the second barrier layer 171, the second conductive layer 181, and the third capping layer 191 stacked from bottom to top, with the second barrier layer 171, the second conductive layer 181, and the third capping layer 191 respectively including the same materials or the same thicknesses as those of first barrier layer 172, the first conductive layer 182 and the second capping layer 192 of the bit line structure 12, or those of the barrier layer 173, the conductive layer 183 and the capping layer 193 of the gate line structure 13, but not limited thereto. After that, as shown in the aforementioned embodiment, the first spacer 201, the second spacer 202, and the third spacer 203 are respectively formed on sidewalls of each stacked structure, thereby forming a resistor structure 21, the bit line structure 12, and the gate line structure 13 within the first region 10A, the second region 10B, and the third region 10C respectively. Then, the interlayer dielectric layer 210, the intermetal dielectric layer 220, and the plugs 231, 232, 233 are sequentially formed, and the fabrications of the aforementioned elements are all the same as those of the aforementioned embodiment and will not be redundantly described hereinafter.

It is noted that, since the mask layer is also formed in the first region 10A while forming the second mask layers 162, 163 in the present embodiment, the final pattern of the resistor structure 21 is defined thereby. Through these arrangements, the deposition process as shown in FIG. 3 for forming the first capping material layer 150 may be optionally omitted in the present embodiment, so that, a resistor structure formed within the first region 10A may only include the first semiconductor layer 141, the second barrier layer 171, the second conductive layer 181, and the third capping layer 191 stacked from bottom to top, without including the first capping layer 151.

Through these performances, the fabrication of the semiconductor memory device 20 according to the another embodiment of the present disclosure is accomplished. According to the aforementioned processes, the resistor structure 21 includes the first semiconductor layer 141, the first capping layer 151, the second barrier layer 171, the second conductive layer 181, and the third capping layer 191 stacked from bottom to top. In the present embodiment, the plugs 231 which are electrically connected to the resistor structure 21 may additionally include an insulating layer (not shown in the drawings) formed on sidewalls of plug openings (not shown in the drawings), to ensure each of the plugs 231 only contacting the first semiconductor layer 141 having silicon phosphide directly, for providing the relative higher resistance. In this way, the formation of the resistor structure 21 is also allowable to be integrated in the general fabricating process of the bit line structure 12, so as to from a memory in the memory region (namely, the second region 10B) of the semiconductor memory device 20, and to form the resistor structure 21 with a higher resistance in another region (namely, the first region 10A) of the semiconductor memory device 20, simultaneously, so as to significantly improve the fabrication efficiency of the semiconductor memory device 20. Then, the semiconductor memory device 20 obtained thereby may therefore gain better performances and structural reliability.

Figure 12:
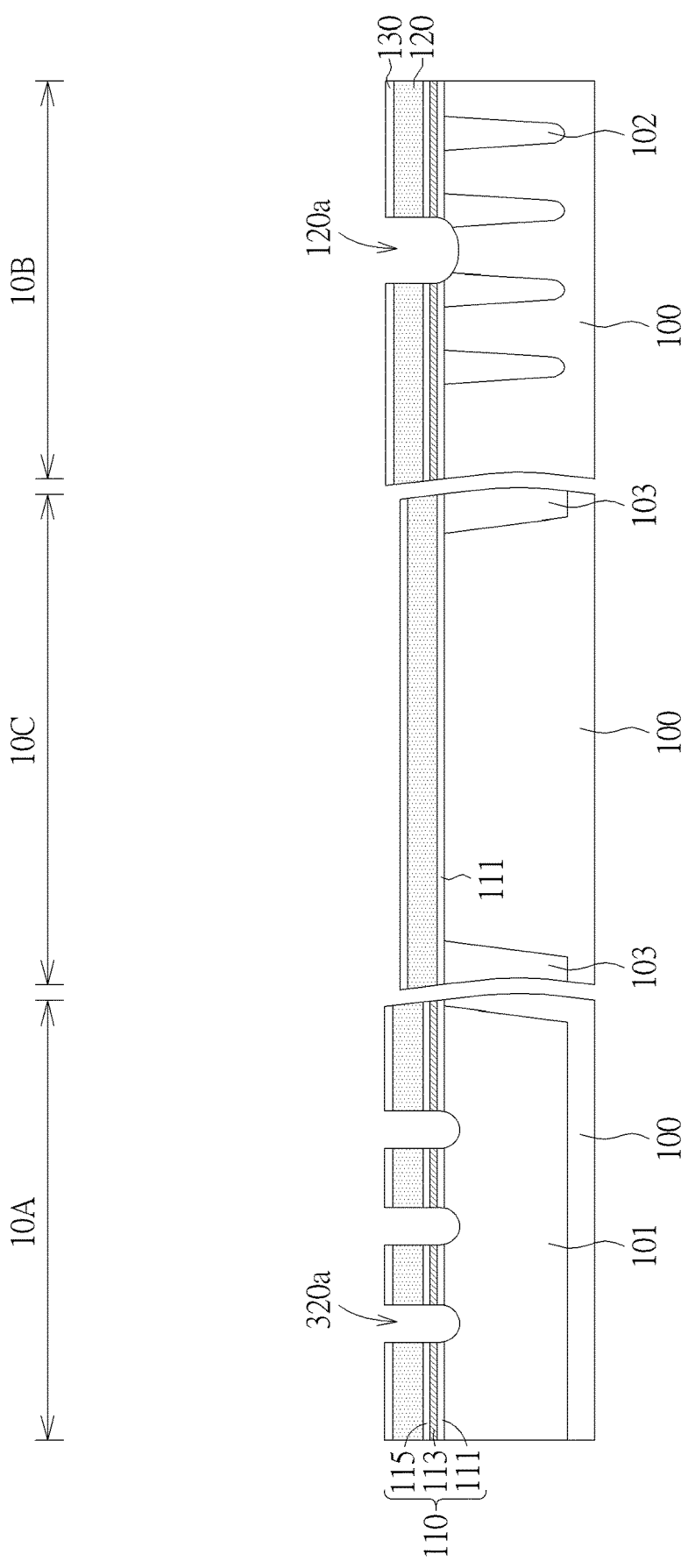

Please refer to FIG. 12 to FIG. 16, which is schematic diagrams illustrating a fabricating method of a semiconductor memory device 30 according to the second embodiment of the present disclosure. The fabricating method of the semiconductor memory device 30 of the present embodiment are substantially the same as those in the aforementioned first embodiment, and all the similarities will not be redundantly described hereinafter. The difference between the present embodiment and the aforementioned first embodiment is in that at least one opening is defined in the first region 10A while defining the contact opening 120a in the second region 10B, for example a plurality of openings 320a as shown in FIG. 12 is defined.

Figure 13:
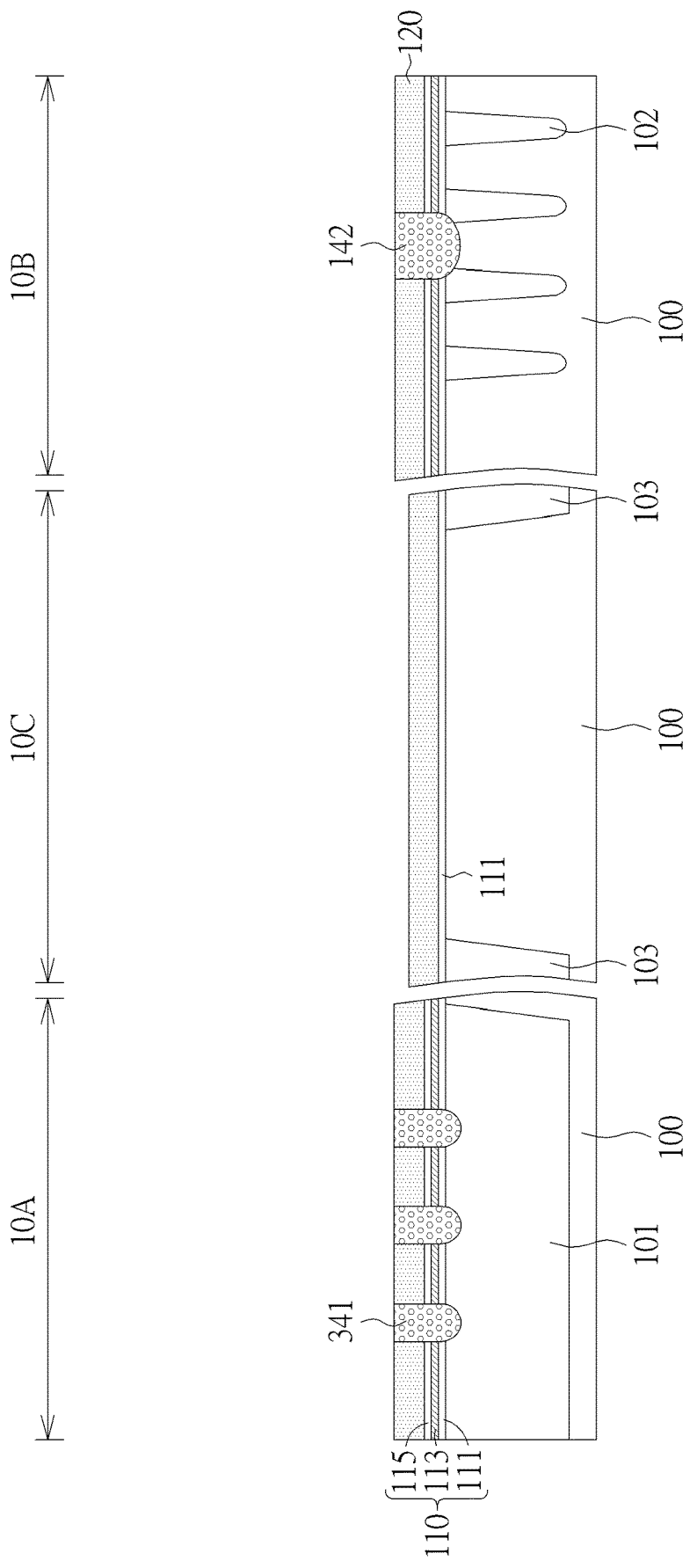

Precisely speaking, as shown in FIG. 12, each of the openings 320a penetrates through the covering material layer 130, the semiconductor material layer 120 and the dielectric layer 110, to expose a portion of the isolating region 101. Next, a deposition process and a planarization process are sequentially performed on the substrate 100, to form the bit line contact 142 in the contact opening 120a, and to form a first semiconductor layer 341 filled in each opening 320a at the same time, with the first semiconductor layer 341 including a plurality of separately portions which are respectively embedded in the semiconductor material layer 120, as shown in FIG. 13.

Figure 14:
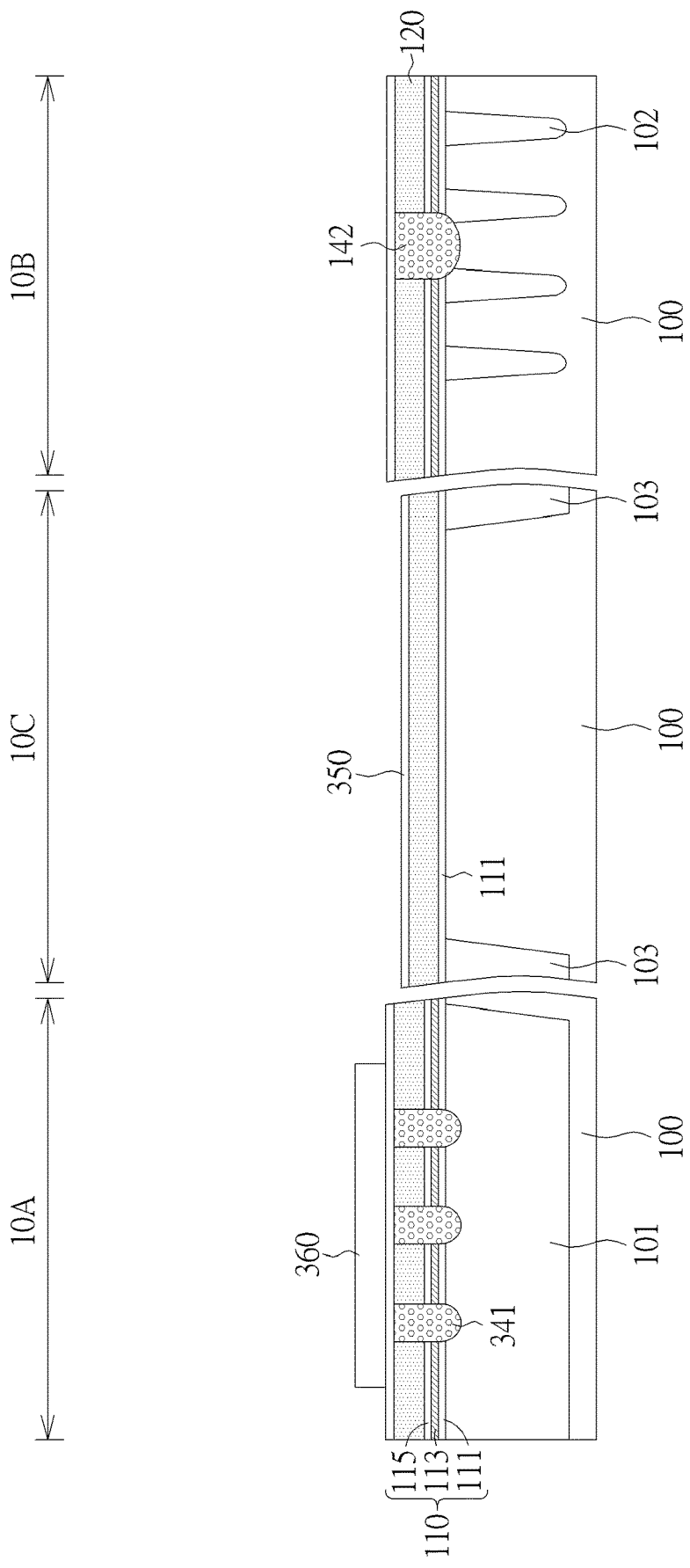

As shown in FIG. 14, a deposition process is further performed on the substrate 100, to form a covering material layer 350 to cover on the semiconductor material layer 120. Then, a first mask layer 360 is formed in the first region 10A, and a patterning process is performed through the first mask layer 360, to sequentially transfer the pattern of the first mask layer 360 into the covering material layer 350, the semiconductor material layer 120, and the dielectric layer 110 underneath, to form a first capping layer 351 and a third semiconductor layer 321 as shown in FIG. 15 in the first region 10A.

Figure 15:
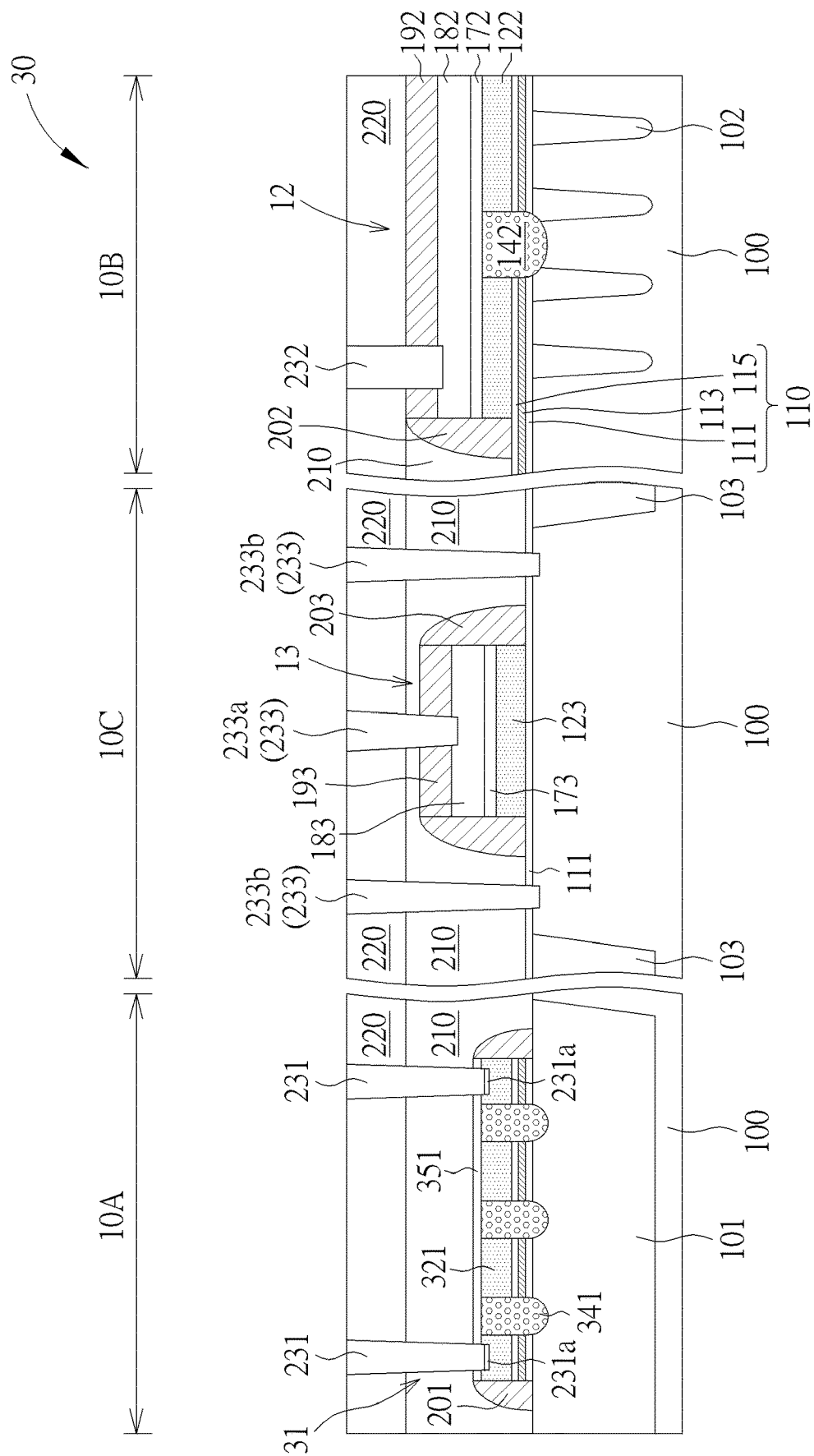

After that, as shown in the aforementioned embodiment (please also referring to FIG. 6 to FIG. 10), the stacked structures, the first spacer 201, the second spacer 202 and the third spacer 203 are sequentially formed on the substrate 100, to form a resistor structure 31, the bit line structure 12, and the gate line structure 13 within the first region 10A, the second region 10B, and the third region 10C respectively, as shown in FIG. 15. Then, the interlayer dielectric layer 210, the intermetal dielectric layer 220, and the plugs 231, 232, 233 are sequentially formed, and the fabrications of the aforementioned elements are all the same as those of the aforementioned embodiment and will not be redundantly described hereinafter. Furthermore, a silicide layer 231a may be further formed between each of the plugs 231 electrically connected to the resistor structure 31 and the third semiconductor layer 321, to enhance the electrically connection between the plugs 231 and the third semiconductor layer 351.

Through these performances, the fabrication of the semiconductor memory device 30 according to the second embodiment of the present disclosure is accomplished. The resistor structure 31 of the present embodiment includes the third semiconductor layer 321 having the doped polysilicon, the first semiconductor layer 341 having the doped silicon phosphide, the first capping layer 351 having an insulating material, and the first spacer 201, with each of the plugs 231 electrically connected to the resistor structure 31 directly contacting the third semiconductor layer 321, for obtaining the relative higher resistance. It is noted that, in the present embodiment, the plurality of portions of the first semiconductor layer 341 is for example embedded in the third semiconductor layer 321, and the first semiconductor layer 341 also include a material (such as the doped silicon phosphide) having the relative higher resistance. Accordingly, plugs (not shown in the drawings) electrically connected to the resistor structure 31 may also directly contact to the first semiconductor layer 341 instead of the third semiconductor layer 321, due to the practical product requirements, but is not limited thereto.

With these arrangements, the formation of the resistor structure 31 also allowable to be integrated in the general fabricating process of the bit line structure 12, with the third semiconductor layer 321 of the resistor structure 31 being simultaneously formed through the fabricating process of the second semiconductor layer 122 of the bit line structure 12, and with the first semiconductor layer 341 of the resistor structure 31 being simultaneously formed through the fabricating process of the bit line contact 142 of the bit line structure 12, so as to significantly improve the fabrication efficiency of the semiconductor memory device 30. Also, the semiconductor memory device 30 obtained thereby may therefore gain better performances and structural reliability.

Figure 16:
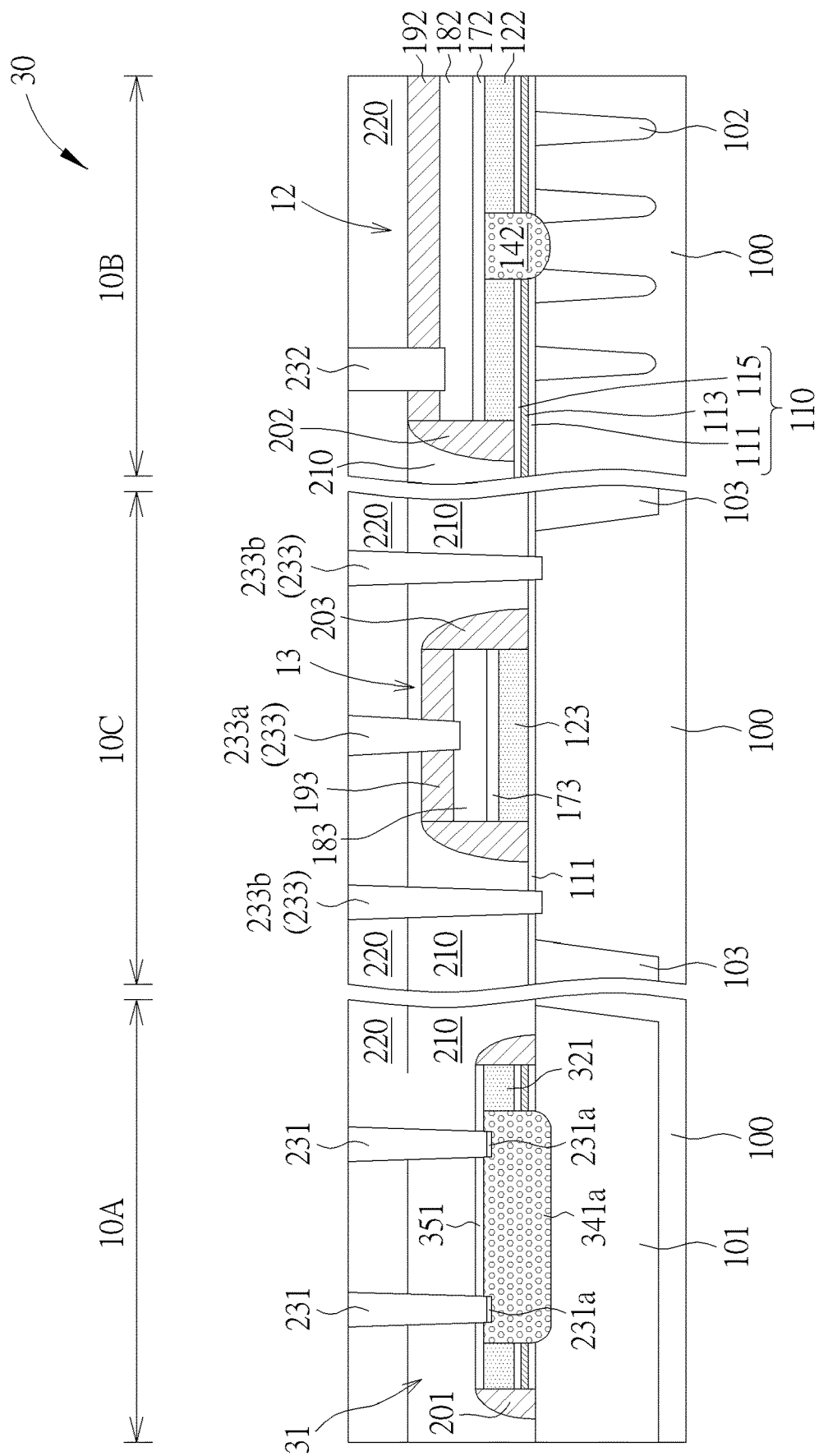

It is also noted that, although the present embodiment is exemplified by disposing the plurality of portions of the first semiconductor layer 341 (including silicon phosphide) in the third semiconductor layer 321 (including polysilicon) at the same time, the practical disposing number of the first semiconductor layer 341 is not limited thereto. As shown in FIG. 16, in another embodiment, a single portion of the first semiconductor layer 341a (including silicon phosphide)

may also be disposed in the third semiconductor layer 321 (including polysilicon), and the plugs 231 electrically connected to the resistor structure 31 may optionally contact to the first semiconductor layer 341a which is embedded in the third semiconductor layer 321, without contacting to the third semiconductor layer 321. With such arrangement, the resistor structure 31 also obtains the relative higher resistance.

Figure 17:
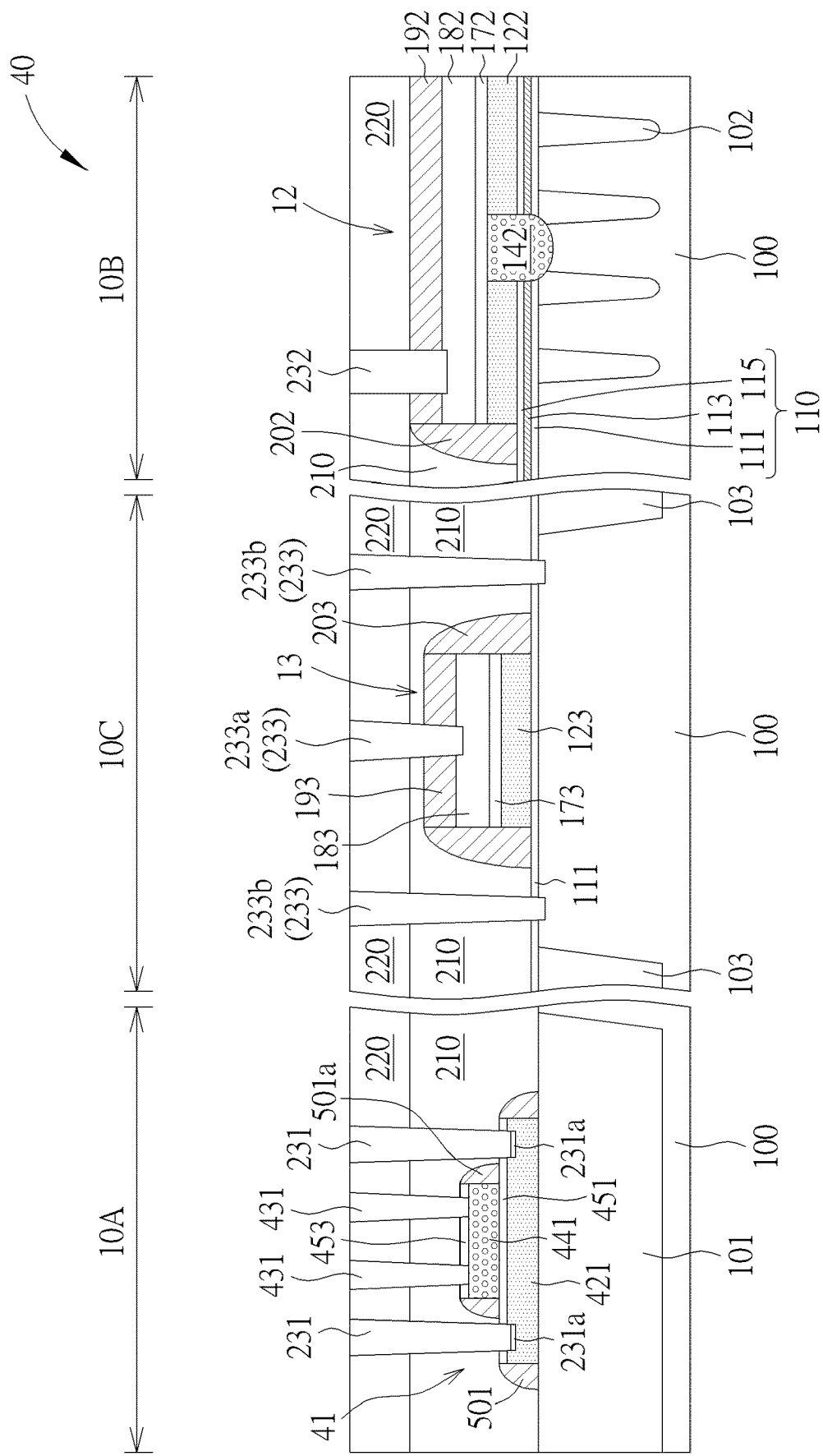
FIG. 17 illustrates a schematic diagram of a semiconductor memory device according to a third embodiment of the present disclosure.

Please refer to FIG. 17, which is a schematic diagram illustrating a semiconductor memory device 40 according to the third embodiment of the present disclosure. The structure of the semiconductor memory device 40 of the present embodiment is substantially the same as that in the aforementioned embodiment, and all the similarities will not be redundantly described hereinafter. The difference between the present embodiment and the aforementioned embodiment is in that, bi-layered semiconductor layers 421, 441 are disposed in a resistor structure 41 within the first region 10A, to provide a relative higher resistance.

Precisely speaking, as shown in FIG. 17, the resistor structure 41 includes the third semiconductor layer 421 having the doped polysilicon, the capping layer 451 having an insulating material, the first semiconductor layer 441 having the doped silicon phosphide, and the capping layer 453 having another insulating material stacked from bottom to top, and the resistor structure 41 further includes a spacer 501 disposed on sidewalls of the third semiconductor layer 421 and the capping layer 451, and a spacer 501a disposed on sidewalls of the first semiconductor layer 441 and the capping layer 453. In the present embodiment, the formation of the resistor structure 41 is also allowable to be integrated in to the general fabricating process of the bit line structure 12. For example, the third semiconductor layer 421 of the resistor structure 41 is formed through the same fabricating process of the second semiconductor layer 122 of the bit line structure 12, and the first semiconductor layer 441 of the resistor structure 41 is formed through the same fabricating process of the bit line contact 142 of the bit line structure 12, with the first semiconductor layer 441, the third semiconductor layer 421 of the resistor structure 41 respectively including the same materials as those of the bit line contact 142 and the second semiconductor layer 122 of the bit line structure 12, but not limited thereto.

With these arrangements, a plurality of plugs 231, 431 electrically connected to the resistor structure 41 may be respectively connected to the third semiconductor layer 421 (including the doped polysilicon) disposed at the bottom layer, and the first semiconductor layer 441 (including the doped silicon phosphide) disposed at the upper layer, so that the third semiconductor layer 421 disposed at the bottom layer and/or the first semiconductor layer 441 disposed at the upper layer may both function like a resistor individually, to provide a relative higher resistance. For example, in one embodiment, the third semiconductor layer 421 disposed at the bottom layer may be extended along a direction (not shown in the drawings) being parallel to the paper surface, as the first semiconductor layer 441 disposed at the upper layer is extended along another direction not shown in the drawings) being perpendicular to the paper surface, but not limited thereto. In this way, the semiconductor memory device 40 of the present embodiment also obtains the better performance and structural reliability.

Figure 18:
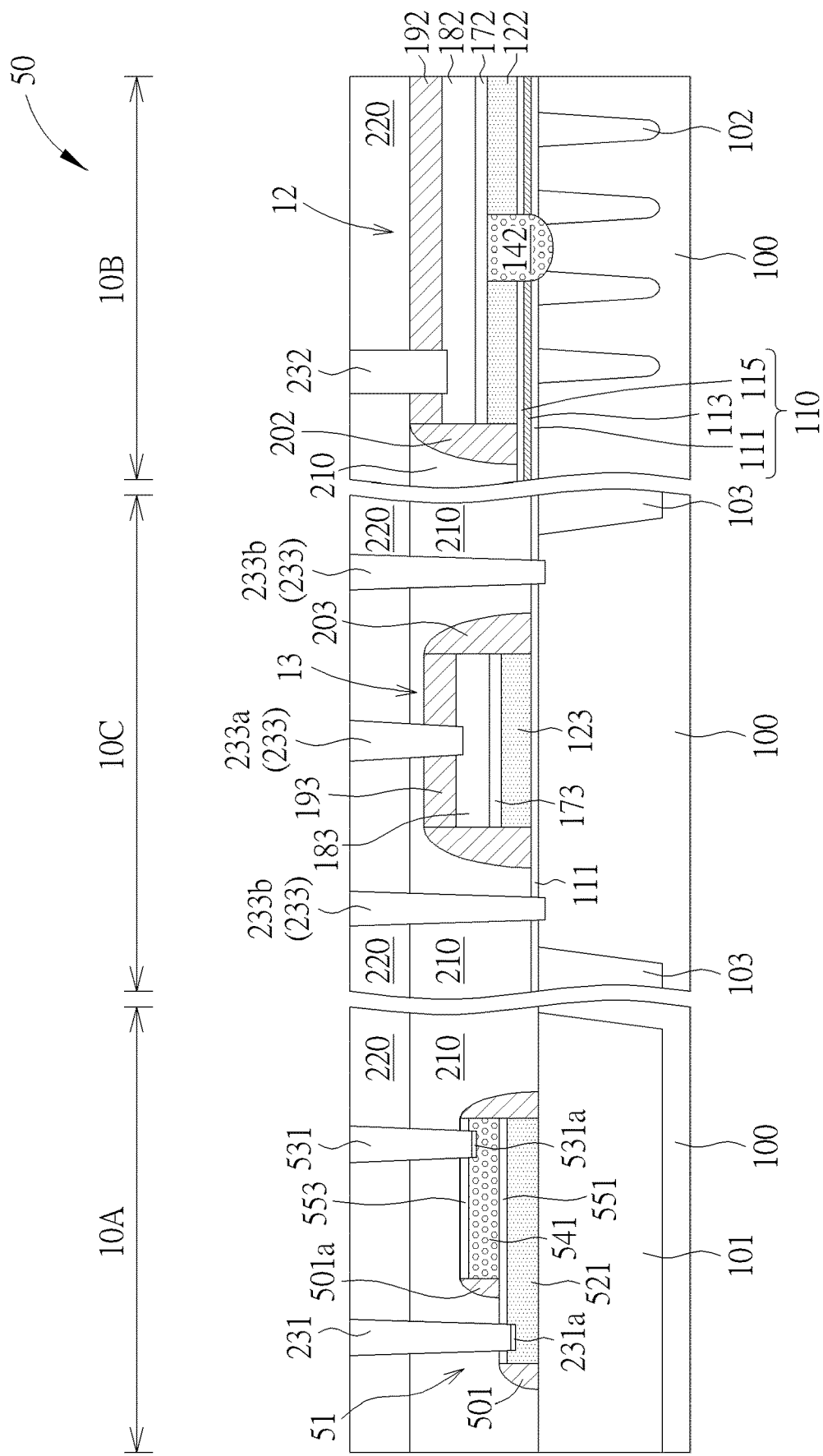
FIG. 18 illustrates a schematic diagram of a semiconductor memory device according to a fourth embodiment of the present disclosure.

Please refer to FIG. 18, which is a schematic diagram illustrating a semiconductor memory device 50 according to the fourth embodiment of the present disclosure. The structure of the semiconductor memory device 50 of the present embodiment is substantially the same as that in the aforementioned embodiment, and all the similarities will not be redundantly described hereinafter. The difference between the present embodiment and the aforementioned embodiment is in that, a capacitor structure 51 is disposed in the first region 10A of the semiconductor memory device 50.

Precisely speaking, as shown in FIG. 18, the capacitor structure 51 includes the third semiconductor layer 521 having the doped polysilicon, the capping layer 551 having an insulating material, the first semiconductor layer 541 having the doped silicon phosphide, and the capping layer 553 having another insulating material stacked from bottom to top, and the capacitor structure 51 further includes a spacer 501 disposed on sidewalls of the third semiconductor layer 521 and the capping layer 551, and a spacer 501a disposed on sidewalls of the first semiconductor layer 541 and the capping layer 553. In the present embodiment, the fabrication of the capacitor structure 51 is also allowable to be integrated in to the general fabricating process of the bit line structure 12. For example, the third semiconductor layer 521 of the capacitor structure 51 is formed through the same fabricating process of the second semiconductor layer 122 of the bit line structure 12, and the first semiconductor 541 of the capacitor structure 51 is formed through the same fabricating process of the bit line contact 142 of the bit line structure 12, with the first semiconductor layer 541, the third semiconductor layer 521 of the capacitor structure 51 respectively including the same materials as those of the bit line contact 142 and the second semiconductor layer 122 of the bit line structure 12, but not limited thereto.

With these arrangements, a plurality of plugs 231, 531 electrically connected to the capacitor structure 51 may be respectively connected to the third semiconductor layer 521 (including the doped polysilicon) disposed at the bottom layer, and the first semiconductor layer 541 (including the doped silicon phosphide) disposed at the upper layer, so that the third semiconductor layer 521 disposed at the bottom layer and the first semiconductor layer 541 disposed at the upper layer may therefore function like a bottom electrode and a top electrode of a capacitor. In addition, silicide layers 231a, 531a may be further formed between each of the plugs 231, 531 electrically connected to the capacitor structure 51, the first semiconductor layer 541 and the third semiconductor layer 521, to improve the electrically connection between the third semiconductor layer 521 and the plugs 231. Accordingly, the semiconductor memory device 50 of the present embodiment also obtains the better performance and structural reliability.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
   a substrate having an active area and a plurality of isolating regions;
   a resistor structure, disposed on the isolating regions, comprising:
   a first semiconductor layer;
   a first capping layer, disposed on the first semiconductor layer; and
   a first spacer, disposed on sidewalls of the first semiconductor layer and the first capping layer;
   a bit line structure, disposed on the substrate to intersect the active area and the isolating regions, and the bit line structure comprising:

a second semiconductor layer;
a first conductive layer, disposed on the second semiconductor layer;
a second capping layer, disposed on the first conductive layer; and
a second spacer, physically contacting sidewalls of the second semiconductor layer, the first conductive layer, the second capping layer and the second spacer; and
a bit line contact, disposed in the substrate to partially extend into the second semiconductor layer, wherein the bit line contact and the first semiconductor layer comprise a same semiconductor material.

2. The semiconductor memory device according to claim 1, wherein the resistor structure further comprises a third semiconductor layer, the first semiconductor layer and the third semiconductor layer comprise different semiconductor materials, and the third semiconductor layer and the second semiconductor layer comprises a same semiconductor material.

3. The semiconductor memory device according to claim 2, wherein the first semiconductor layer is embedded in the third semiconductor layer and is partially extended into the substrate.

4. The semiconductor memory device according to claim 3, further comprising:
a plurality of plugs electrically connected to the first semiconductor layer respectively.

5. The semiconductor memory device according to claim 3, further comprising:
a plurality of plugs electrically connected to the third semiconductor layer respectively.

6. The semiconductor memory device according to claim 3, wherein the first semiconductor layer comprises a plurality of portions which are separated disposed from each other.

7. The semiconductor memory device according to claim 2, wherein the third semiconductor layer is disposed on the first semiconductor layer.

8. The semiconductor memory device according to claim 7, further comprising:
a plurality of plugs electrically connected to the first semiconductor layer and the third semiconductor layer respectively.

9. The semiconductor memory device according to claim 1, further comprising:
a second conductive layer and a third capping layer, sequentially disposed on the first capping layer, the third capping layer and the second capping layer comprises a same material; and
a plurality of plugs disposed on the substrate, one of the plugs physically contacting the first semiconductor layer of the resistor structure, and another one of the plugs physically contacting the first conductive layer of the bit line structure.

10. The semiconductor memory device according to claim 1, further comprising:
an interlayer dielectric layer disposed on the substrate, a top surface of the interlayer dielectric layer is coplanar with a top surface of the second capping layer, and the interlayer dielectric layer covers the resistor structure.

11. The semiconductor memory device according to claim 1, wherein a top surface of the first spacer is lower than a top surface of the second spacer, and the first capping layer and the second capping layer comprise different materials.

12. The semiconductor memory device according to claim 1, further comprising:
a plurality of plugs disposed on the substrate, one of the plugs physically contacting the first semiconductor layer of the resistor structure, and another one of the plugs physically contacting the first conductive layer of the bit line structure.

* * * * *